United States Patent
Schwed et al.

(10) Patent No.: US 6,420,252 B1
(45) Date of Patent: Jul. 16, 2002

(54) METHODS OF FORMING ROBUST METAL CONTACTS ON COMPOUND SEMICONDUCTORS

(75) Inventors: Stephen Schwed, Bridgewater, NJ (US); Louis A. Koszi, Foglesville, PA (US); Edward W. Douglas, Randolph; Michael G. Brown, Clinton, both of NJ (US)

(73) Assignee: Emcore Corporation, Somerset, NJ (US)

( * ) Notice: Subject to any disclaimer, the term of this patent is extended or adjusted under 35 U.S.C. 154(b) by 0 days.

(21) Appl. No.: 09/568,065

(22) Filed: May 10, 2000

(51) Int. Cl.⁷ .............................................. H01L 21/44
(52) U.S. Cl. ........................ 438/597; 438/602; 438/618; 438/637
(58) Field of Search ................................ 438/597, 602, 438/605, 627, 637, 639, 643, 647, 653, 657, 603, 604, 618

(56) References Cited

U.S. PATENT DOCUMENTS

| | | | |
|---|---|---|---|
| 5,027,187 A | 6/1991 | O'Mara, Jr. et al. | 357/65 |
| 5,093,225 A | 3/1992 | Homstrom et al. | 430/311 |
| 5,153,557 A | 10/1992 | Partin et al. | 338/32 R |
| 5,256,249 A | 10/1993 | Hsie et al. | 156/656 |
| 5,336,905 A | 8/1994 | Bosman et al. | 257/54 |
| 5,360,697 A | 11/1994 | Mehra | 430/314 |
| 5,484,747 A | 1/1996 | Chien | 437/190 |
| 5,817,572 A | 10/1998 | Chiang et al. | 438/624 |
| 5,888,892 A | * 3/1999 | Yanagida | 438/614 |
| 5,986,347 A | 11/1999 | Donohoe et al. | 257/774 |
| 6,107,191 A | * 8/2000 | Han | 438/637 |
| 6,137,178 A | * 10/2000 | Park | 257/758 |

* cited by examiner

Primary Examiner—Matthew Smith
Assistant Examiner—Craig P. Lytle
(74) Attorney, Agent, or Firm—Lerner, David, Littenberg, Krumholz & Mentlik, LLP

(57) ABSTRACT

A method of forming a self-aligned contact on a semiconductor includes forming a layer of a dielectric material over a semiconductor, providing a photoresist layer over the dielectric layer and then exposing the photoresist layer with a desired pattern and developing an opening in the photoresist layer. The dielectric material exposed through the photoresist layer opening is then removed to form a contact opening extending through the dielectric material to the semiconductor. The photoresist layer is then eroded so as to enlarge the size of the opening in the photoresist layer, whereby the dielectric material adjacent the contact opening is exposed through the enlarged opening of the photoresist layer. A barrier metal is then deposited in the enlarged opening of the photoresist layer and in the contact opening of the dielectric material, whereby the barrier metal overlies the exposed portion of the dielectric material. A conductive metal is then deposited atop the barrier metal. The barrier metal isolates the contact metal from the semiconductor, thereby preventing interaction or intermixing of the contact metal and the semiconductor.

19 Claims, 15 Drawing Sheets

FIG. IJ
(PRIOR ART)
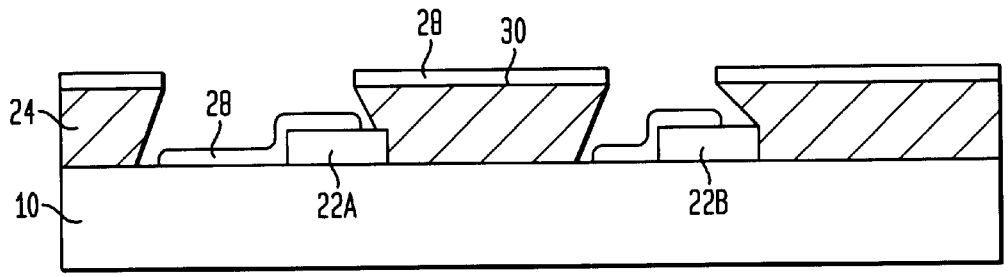
FIG. IJ-1
(PRIOR ART)
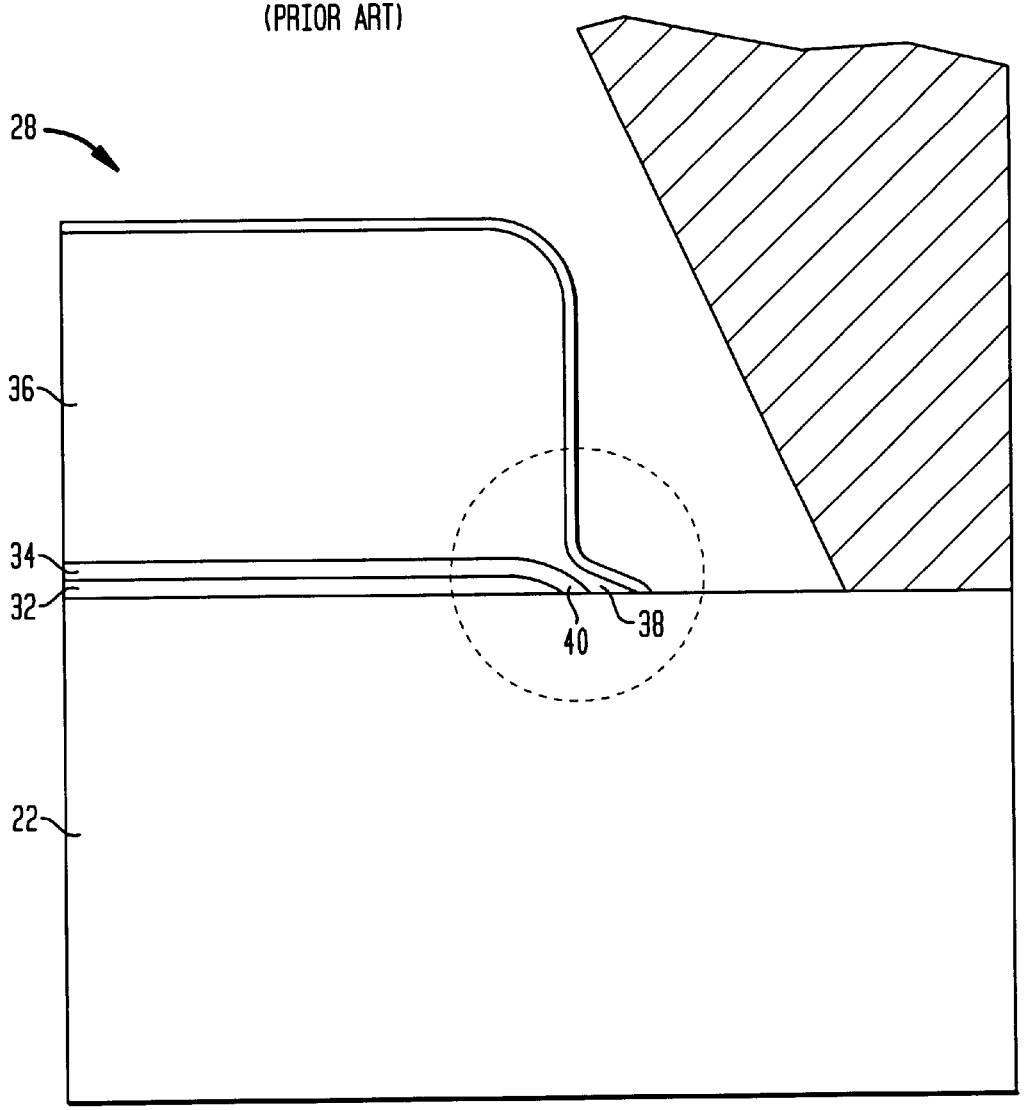

METHODS OF FORMING ROBUST METAL CONTACTS ON COMPOUND SEMICONDUCTORS

FIELD OF THE INVENTION

The present invention is related to forming contacts on semiconductors and is particularly related to methods for forming self-aligned contacts on compound semiconductors.

BACKGROUND OF THE INVENTION

When metal contacts are formed on compound semiconductors, there is generally a need to provide a diffusion barrier between the contact metal and an active surface of the compound semiconductor. The diffusion barrier, which typically comprises materials such as platinum, tungsten, palladium and combinations or alloys thereof, is necessary to prevent contact and subsequent interaction between the contact metal and the semiconductor material. As is well known to those skilled in the art, interaction of the contact metal and the semiconductor material is highly undesirable. Such interaction may result in one or more elements of the compound semiconductor diffusing or intermixing with the contact metal, thereby altering the operational characteristics of the contact metal and semiconductor. Such interaction may degrade the crystalline structure of the semiconductor. Such interaction may also result in the formation of an alloy between the compound semiconductor and the contact metal, thereby changing the melting temperature of the semiconductor. In addition, the metal contacts formed on the semiconductor may not be as robust, and may be subject to more rapid and severe degradation under conditions of time and/or temperature than would otherwise occur with unmixed substances. Thus, barrier layers are typically provided to inhibit this reaction.

One prior art method for forming contacts on semiconductors is shown in FIGS. 1A–1N. Referring to FIG. 1A, a substrate 10 having a top surface 12 may comprise a dielectric or semiconductor material. A layer of a semiconductor material 14 is provided atop the first surface 12 of the substrate 10, as shown in FIG. 1B. Referring to FIG. 1C, a photoresist material 16 is then deposited atop the semiconductor layer. Referring to FIG. 1D, a photolithographic process may then be used to develop selected portions of the photoresist layer 16. In FIG. 1D, photoresist layer 16 has first sections 18A, 18B, 18C that are developed while second sections 20A, 20B remain undeveloped.

As shown in FIG. 1E, the developed portions of 18A, 18B, 18C of photoresist layer 16 are removed, leaving behind the undeveloped portions 20A, 20B. The undeveloped portions 20A, 20B of photoresist layer overlie first sections 14A, 14B of the semiconductor layer 14, while second sections 14C, 14D, 14E of the semiconductor layer remain exposed. Referring to FIG. 1F, the second sections 14C, 14D, 14E of the semiconductor layer are then removed, leaving behind semiconductor mesas 22A, 22B atop the first surface 12 of substrate 10. As shown in FIG. 1G, the photoresist material is then stripped away to leave semiconductors exposed atop substrate 10. Referring to FIG. 1H, a second photoresist layer 24 is then provided atop the semiconductor mesas 22A, 22B and the top surface 12 of substrate 10. Referring to FIG. 1I, the second photoresist layer 24 is then subjected to a photolithographic process to form openings 26 therein. The openings generally conform to a desired pattern for contacts or conductive traces.

Referring to FIG. 1J, a metal 28 is then deposited atop the structure. The metal 28 covers a top surface 30 of the second photoresist layer 24 and the portions of the semiconductor mesa 22A, 22B and substrate 10 exposed through the photoresist openings.

FIG. 1J-1 shows a magnified view of the metal 28 deposited atop one of the semiconductor mesas 22 shown in FIG. 1J. Typically, when a contact 28 is formed atop a semiconductor device, the contact comprises a multi-layer structure. Each layer preferably comprises a conductive metal. In the structure shown in FIG. 1J-1, the contact 28 is formed by first depositing an adhesion metal 32 selected to form a bond with the semiconductor device. Next, a barrier metal 34 is deposited atop the adhesion metal. A contact metal, such as gold, silver, aluminum or copper, is then deposited atop the barrier metal. The barrier metal is designed to provide a diffusion barrier between the active surface of the semiconductor device and the contact metal deposited atop the barrier metal.

The various metal layers are provided by depositing metal particles atop the semiconductor. This is typically accomplished in a deposition tool such as by metal evaporation or by metal sputtering, wherein metal is deposited onto a semiconductor to build up a layer of a particular metal. The metal layers can have different thicknesses depending upon the required function of the device. For example, the contact metal layer 36 is typically thicker than the barrier metal layer. In addition, the thickness of each layer can be controlled by regulating the specific manufacturing techniques used when depositing the layers. As is generally known to those skilled in the art, the edges of later deposited, thicker metal layers tend to overlap the edges of earlier deposited, thinner metal layers. This is because the later deposited, thicker metal layer tends to spread over the edge of the earlier deposited, thinner layer. The overlapping edge of the later deposited layer is commonly referred to as a tail. As used herein, the term "tail" means the edge of the thicker metal layer that overlaps the edge of the thinner metal layer. As shown in FIG. 1J-1, the overlapping edge 38 of contact metal layer 36 extends beyond the edge 40 of barrier metal layer 34 to form tail 38. As a result, the contact metal layer 36 is able to contact the active surface of semiconductor 22, resulting in the contact metal-semiconductor interaction problems described above.

FIG. 1J-2 shows a magnified view of the edge of contact 28 formed atop semiconductor device 22. As shown, the tail 38 of contact metal layer 36 is in direct contact with the active surface of semiconductor 22. As a result, the contact metal 36 may interact with semiconductor 22, causing the adverse problems described above.

One adverse consequence of contact metal-semiconductor interaction is shown in FIG. 1K. When the elements comprising the compound semiconductor diffuse into the contact metal, an alloy 25 may form between the semiconductor 22 and the contact metal 36. The formation of the alloy 25 is undesirable as it may adversely affect the mobility, the speed of switching, and/or the performance of the semiconductor. In certain embodiments, performance may suffer because the quality of the crystalline structure of the semiconductor is adversely affected. Diffusion may also alter the resistance of the semiconductor or the contact metal 36, thereby changing the operating characteristics of the structure.

Referring to FIGS. 1L and 1M, after the contacts 28 have been formed atop the semiconductors 22, a passivation layer 42 is provided atop the first surface 12 of the substrate 10, and over the semiconductor mesas 22 and the contacts 28 deposited thereon. Referring to FIG. 1N, the passivation layer 42 is then selectively removed to form contact openings 44 that extend to the contact metal 28.

Thus, there is a need for a method for forming robust contacts for compound semiconductors wherein the contact metal does not interact with the semiconductor. This may be accomplished by providing a barrier layer that effectively isolates the contact metal from the semiconductor.

SUMMARY OF THE INVENTION

In certain preferred embodiments of the present invention, a method of forming a self-aligned contact on a semiconductor includes forming a layer of a dielectric material, commonly referred to as a passivation layer, atop a semiconductor. The dielectric material layer preferably comprises an impervious, non-conductive material. Preferred dielectric materials for the passivation layer include glass, ceramic, silicon oxide, silicon nitride and aluminum oxide. A layer of a photoresist may then be provided over the layer of dielectric material. A photolithographic process may then be used to expose a desired pattern in the photoresist layer and to develop openings in the photoresist layer. The openings developed in the photoresist layer preferably correspond to the desired pattern exposed in the photoresist layer. In certain preferred embodiments, the photolithographic process is carried out so that the openings formed in the photoresist layer define an undercut profile.

After the opening has been developed in the photoresist layer, the dielectric material exposed through the photoresist layer opening is preferably removed so as to form a contact opening extending through the dielectric material layer to the semiconductor. The selected portions of the dielectric material layer may be removed by etching away the dielectric material. Preferred etching techniques may include wet chemical etching or dry etching. As described above, the etchant will remove dielectric material so as to expose a top surface of the semiconductor. The pattern etched in the dielectric material layer preferably conforms to the pattern of the opening in the photoresist layer.

After the contact openings have been formed through the dielectric material layer, the photoresist layer is further eroded, whereby the overall volume and/or area of the photoresist layer is reduced. As a result, the size of the opening in the photoresist layer is enlarged. Thus, the dielectric material adjacent the contact opening is exposed through the enlarged opening of the photoresist layer. A barrier metal such as platinum, tungsten, palladium and/or combinations or alloys thereof, may then be deposited atop the photoresist layer and in the enlarged opening of the photoresist layer. As a result, the barrier metal will be deposited in the contact opening of the dielectric material and atop the dielectric material exposed through the enlarged opening of the photoresist layer. At least a portion of the barrier metal will overlie the exposed edges of the dielectric material layer. After the barrier metal is deposited, a contact metal may then be deposited atop the barrier metal. Preferred contact metals include gold, silver, aluminum and copper and combinations or alloys thereof. The barrier metal layer overlaps an edge of the dielectric material layer so as to isolate the contact metal from the semiconductor. As a result, the barrier metal will prevent the contact metal from interacting with the semiconductor, thereby avoiding the problems discussed above.

Although the present invention is not limited by any particular theory of operation, it is believed that isolating the contact metal layer from the active surface of a semiconductor will result in a more reliable semiconductor device. The present invention ensures that any contact metal deposited atop the semiconductor device will be isolated from the semiconductor by the barrier metal. The isolation of the contact metal from the semiconductor generally results from the step of further eroding the photoresist layer after initially removing portions of the dielectric material layer. As the photoresist layer is further eroded, the size of the openings through the photoresist layer will increase in area. As a result, additional portions of the dielectric material layer will be exposed through the enlarged openings of the eroded photoresist layer. These additional portions of dielectric material will then be covered by a barrier metal during the barrier metal deposition step. If the photoresist layer were not further eroded to increase the size of the openings, very little barrier metal would actually be deposited atop the dielectric material. The eroding photoresist layer step exposes more of the dielectric material through the photoresist layer opening so as to dramatically increase the amount of barrier metal deposited atop the dielectric material layer.

In certain preferred embodiments, the contact is a multi-layer structure that preferably includes an adhesion metal, a barrier metal and a contact metal. The multi-layer contact may be formed by first depositing the adhesion metal atop the contact opening, followed by the barrier metal. Next, the contact metal is deposited atop the barrier metal and a second adhesion metal layer is deposited atop the contact metal. The contact metal layer may form the thickest layer of the multi-layer structure. After the contacts have been formed atop the semiconductor, the method may also include the step of lifting off the photoresist layer and any metal deposited atop the photoresist layer.

In further preferred embodiments of the present invention, a method of forming a self-aligned contact on a semiconductor includes forming a layer of a dielectric material over a semiconductor, providing a photoresist layer over the dielectric layer and exposing the photoresist layer with a desired pattern. One or more openings are then developed in the photoresist layer, the openings corresponding to the desired pattern exposed in the photoresist layer. The dielectric material exposed through the one or more openings of the photoresist layer is then removed so as to form one or more contact openings that extend through the dielectric material to the semiconductor. The photoresist layer is then eroded so as to reduce the volume and/or area of the photoresist layer. A barrier metal is then deposited in the one or more openings of the photoresist layer so as to cover the one or more contact openings of the dielectric material. At least a portion of the barrier metal layer preferably overlies the dielectric material exposed through the enlarged openings of the photoresist layer. A contact metal may then be deposited atop the barrier metal. Because the photoresist layer is eroded, the deposited barrier metal overlaps at least a portion of the dielectric material layer. In turn, the barrier metal isolates the contact metal from the semiconductor.

In accordance with still further preferred embodiments of the present invention, a method of forming self-aligned contacts on a semiconductor includes providing a substrate having a first surface and forming a plurality of semiconductors, such as semiconductor mesas, atop the first surface of the substrate. A dielectric passivation layer is then formed over the substrate and the semiconductors and a photoresist layer is provided over the dielectric passivation layer. The photoresist layer is then exposed to a desired pattern and the photoresist layer is developed to form an opening therein. The opening in the photoresist layer substantially conforms to the desired pattern to which the photoresist layer had been exposed. The dielectric material exposed through the photoresist layer opening is then removed, such as by using an etching process, so as to form contact openings. Each of the contact openings preferably extends through the dielectric material to a top surface of one of the semiconductor mesas. The photoresist layer is then preferably eroded so as to enlarge the size of the openings in the photoresist layer. As a result, the dielectric material adjacent the contact openings is exposed through the enlarged openings of the photoresist layer. A barrier metal may then be deposited through the enlarged openings of the photoresist layer, atop the dielectric material exposed through the enlarged openings and in the contact openings of the dielectric material layer. As a result, the deposited barrier metal will overlie the portions of the dielectric material layer exposed through the enlarged openings. A contact metal may then be deposited atop the barrier metal so that the barrier metal isolates the contact metal from the active surface of the semiconductors so as to prevent the contact metal from diffusing into the semiconductors.

These and other preferred embodiments of the present invention will be described in more detail below.

BRIEF DESCRIPTION OF THE DRAWINGS

FIGS. 4A–4G-2 show methods of making self-aligned contacts for compound semiconductors, in accordance with still further preferred embodiments of the present invention.

DETAILED DESCRIPTION OF THE PREFERRED EMBODIMENTS

Figure 1A:
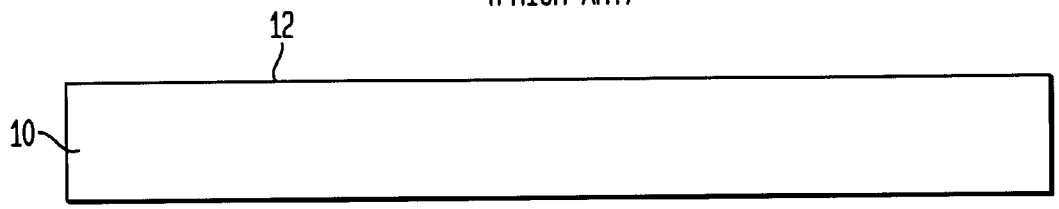
FIGS. 1A–1N show a prior art method of making contacts on a compound semiconductor device.
Figure 1B:
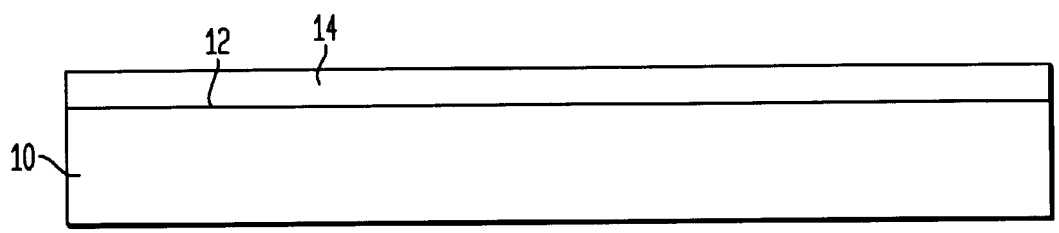
FIGS. 3A–3F-1 show a method of making self-aligned contacts on a compound semiconductor device, in accordance with further preferred embodiments of the present invention.
Figure 1C:
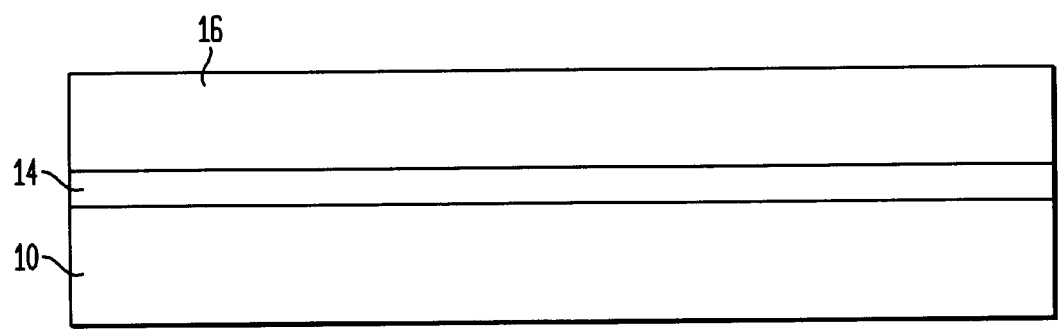
Figure 1D:
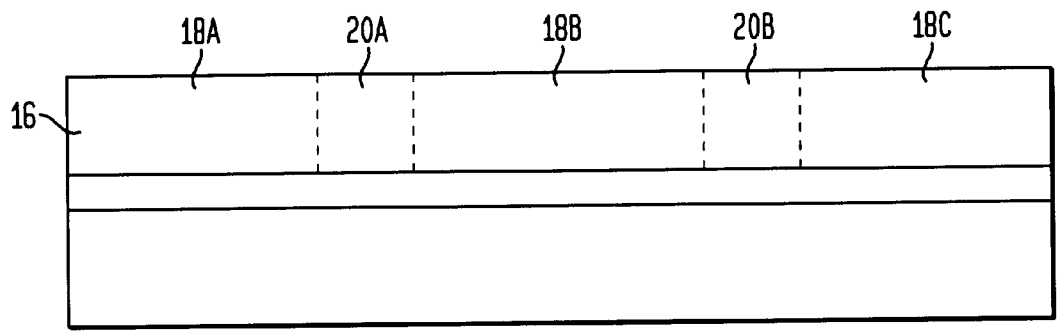
Figure 1E:
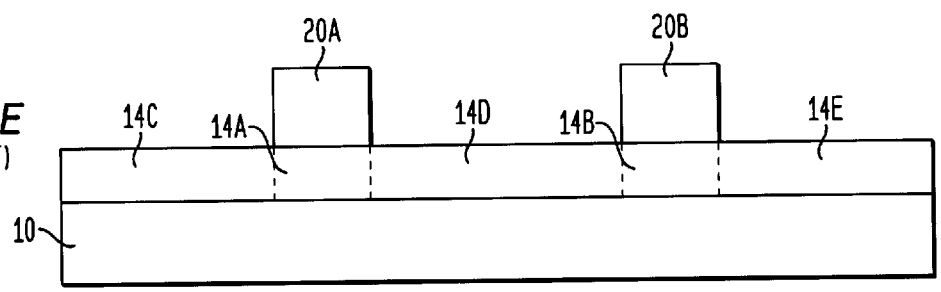
Figure 1F:
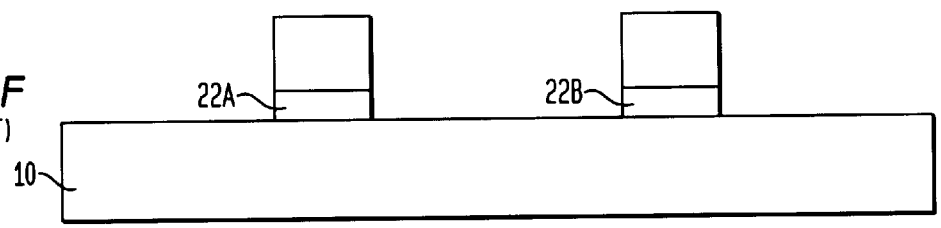
Figure 1G:
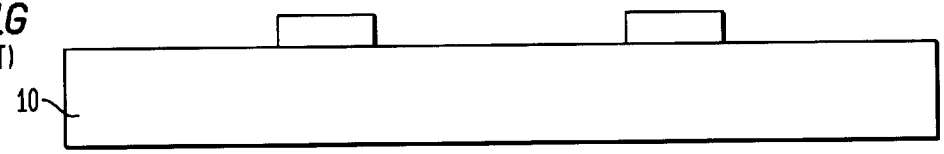
Figure 1H:
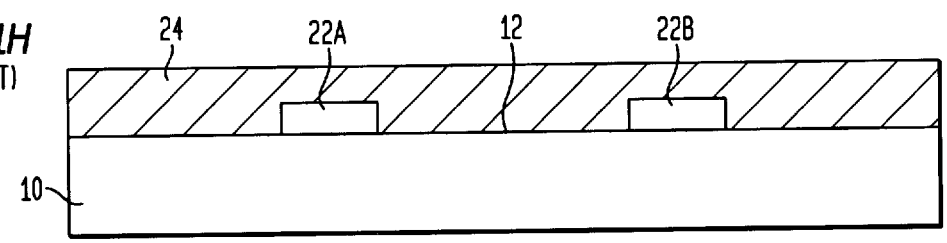
Figure 1I:
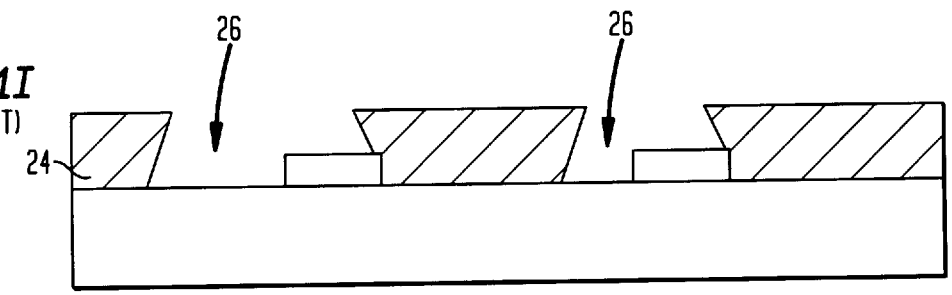
Figures 1, 1J, 2:
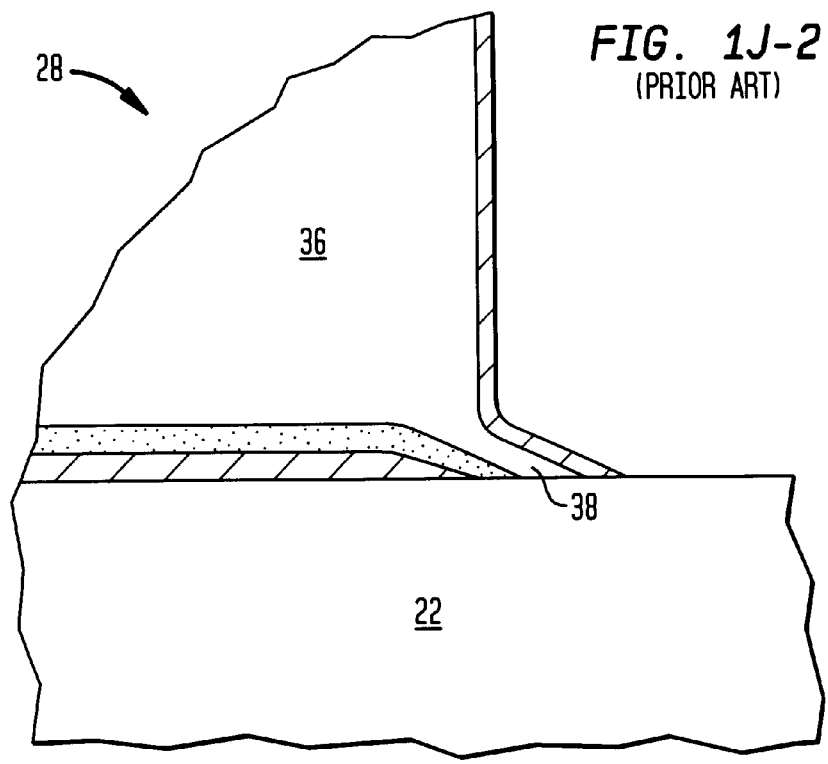
FIGS. 2A–2G-2 show a method of making self-aligned contacts on a compound semiconductor device, in accordance with certain preferred embodiments of the present invention.
Figure 1K:
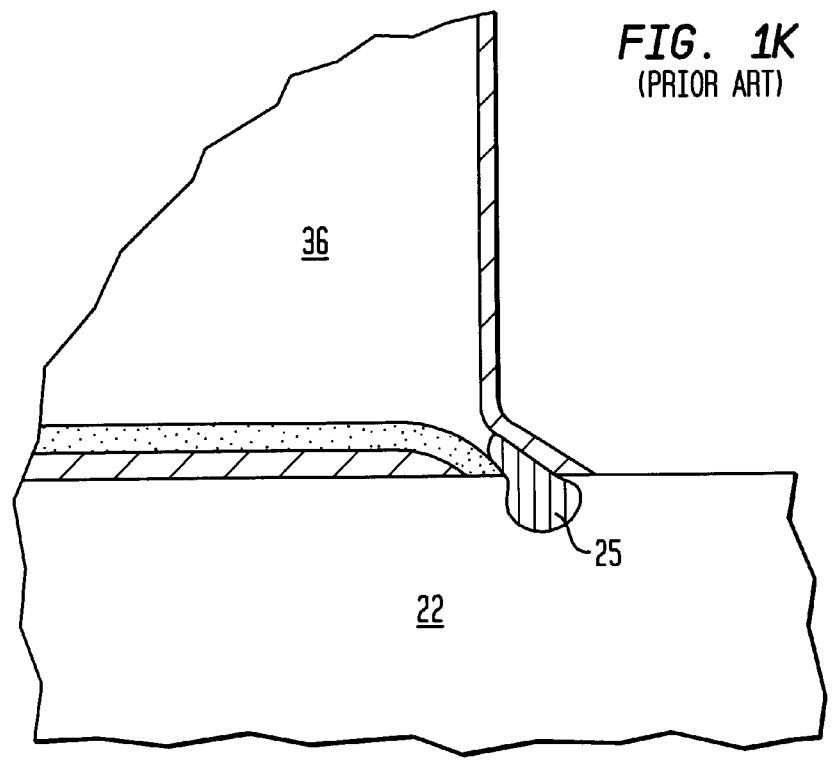
Figure 1L:
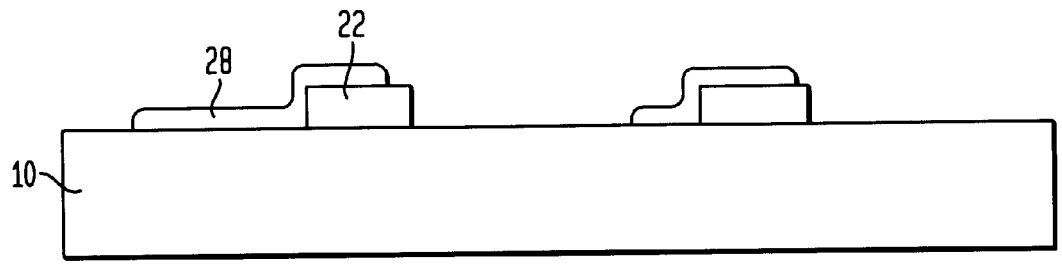
Figure 1M:
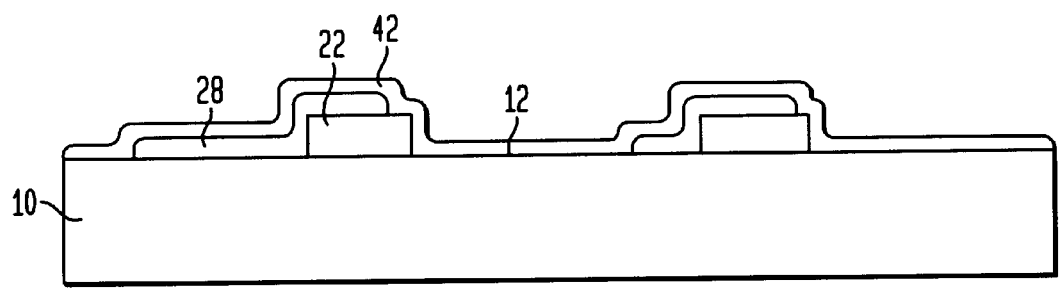
Figure 1N:
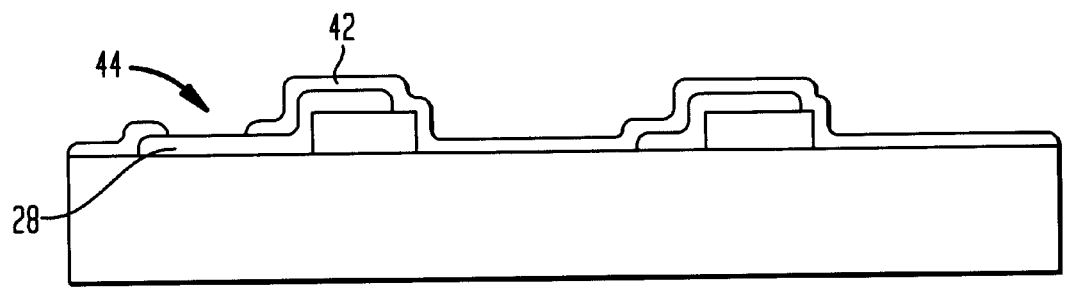
Figure 2A:
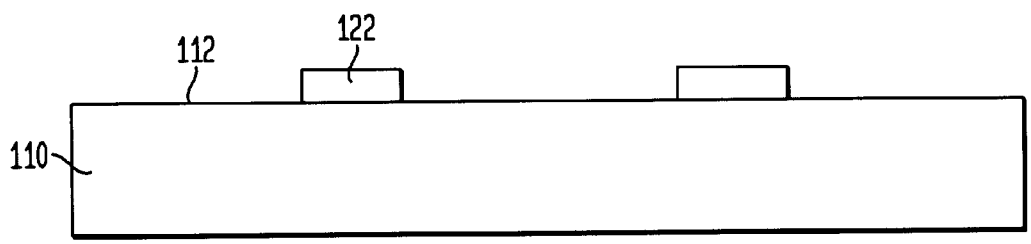
Figure 2B:
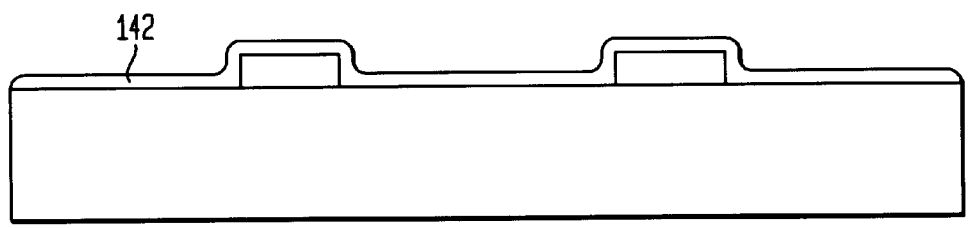

FIGS. 2A–2G-2 show methods of making self-aligned contacts for compound semiconductors, in accordance with certain preferred embodiments of the present invention. Referring to FIG. 2A, a substrate 110 has a top surface 112 with semiconductors 122 formed thereon. The semiconductors may have a profile that is commonly referred to as a mesa structure. Referring to FIG. 2B, immediately after formation of the semiconductors, a passivation layer 142 of dielectric material is deposited atop the first surface of the substrate and over the semiconductors. The passivation layer preferably comprises glass, ceramic, silicon oxide, silicon nitride or aluminum oxide.

Figure 2C:
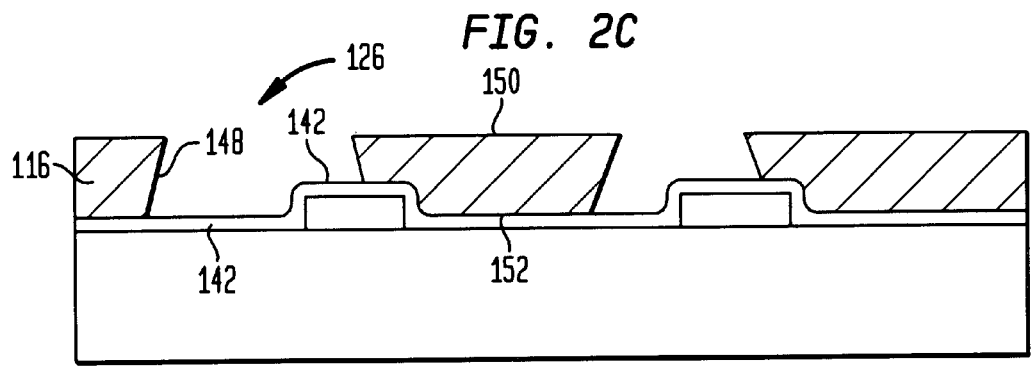

A photolithographic process may then be used to form desired patterns atop the photoresist. The desired patterns, which will preferably be used to electrically interconnect one or more of the semiconductors, may extend in any direction atop the substrate. Referring to FIG. 2C, a layer of photoresist material 116 is then provided atop the substrate 110. The photoresist layer 116 is exposed and developed so as to selectively remove portions of the photoresist to form desired patterns in the photoresist layer. The openings 126 in photoresist layer 116 preferably expose portions of the dielectric passivation layer 142 therethrough. In certain preferred embodiments, photoresist layer 116 is exposed and developed in such a way that the photoresist layer has an "undercut" profile when viewed in cross section. As used herein, the term undercut means that sidewalls 148 of the photoresist surrounding the photoresist openings 126 will taper outwardly from a top surface 150 of the photoresist layer toward the bottom 152 of the photoresist layer 116.

Figure 2D:
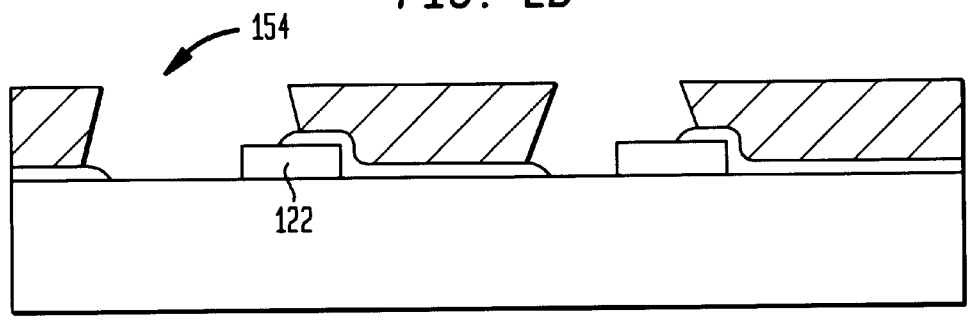
Figure 2E:
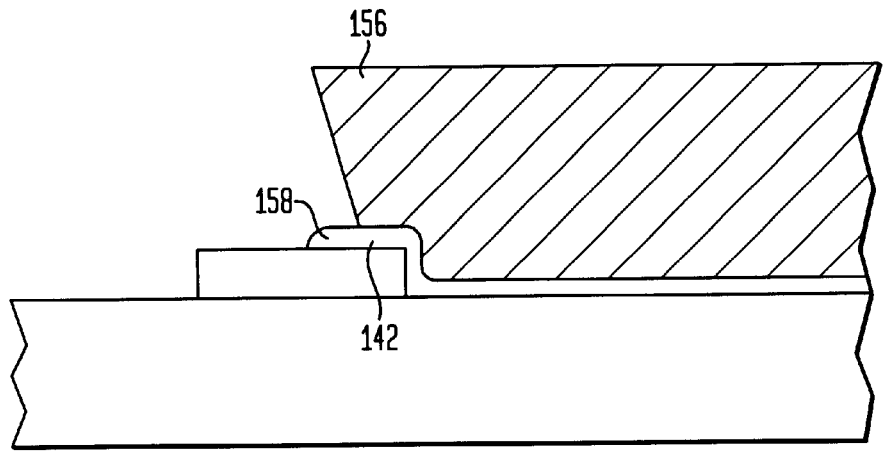

Referring to FIG. 2D, portions of the dielectric material layer 142 exposed through the photoresist layer openings 126 are then etched away, such as by using an etching step, to leave contact openings 154 that extend to semiconductor device 122. FIG. 2E shows a magnified view of the structure shown in FIG. 2D after the portion of dielectric material layer exposed through the photoresist layer has been etched away. The photoresist layer may have an undercut profile, with a projection 156 extending beyond the base of the photoresist layer. In other words, the opening in the photoresist layer is defined by a sidewall which slopes outwardly from an upper surface to a lower surface of the photoresist layer. The projection 156 overlies a protected portion 158 of the dielectric material, thereby preventing the protected portion 158 of the dielectric material 142 from being etched away.

Figure 2F:
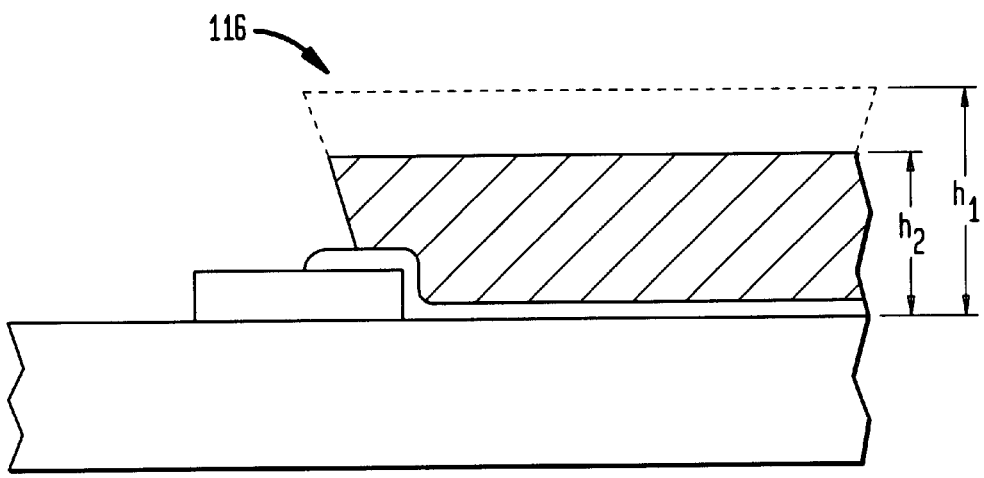

Referring to FIGS. 2F and 2F-1, the photoresist layer 116 is then exposed to the etchant which further erodes the photoresist layer. As the photoresist layer is eroded, the size of the openings in the photoresist layer generally increases. As shown in FIG. 2F-1, before the photoresist layer 116 is eroded, the upper edge 156 of the photoresist layer overhangs protected portion 158 of dielectric material 142. After the eroding step, the upper edge 156' of the photoresist layer 116 has receded by a distance designated $x_1$, thereby exposing the protected portion 158 of the dielectric material 142.

Figure 2G:
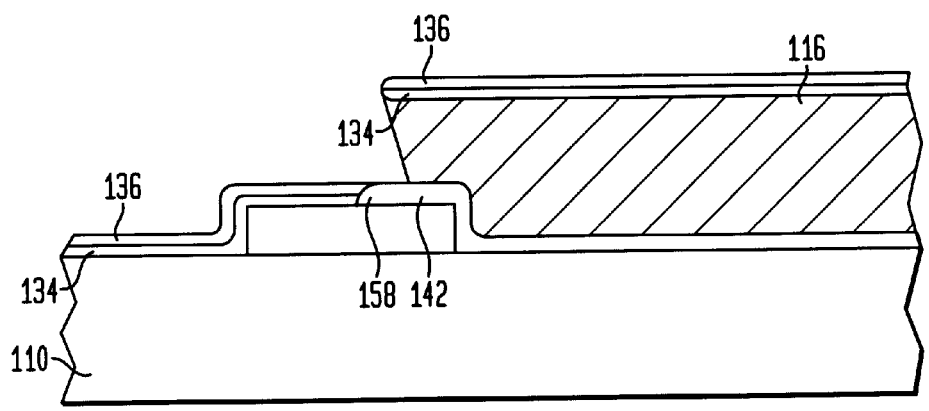
Figures 1, 2F:
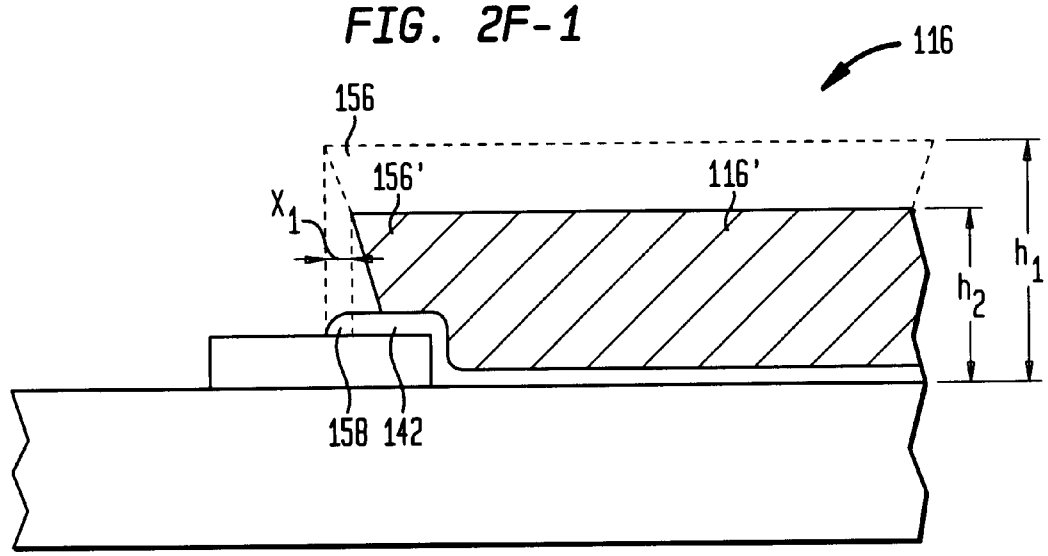
Figures 1, 2G:
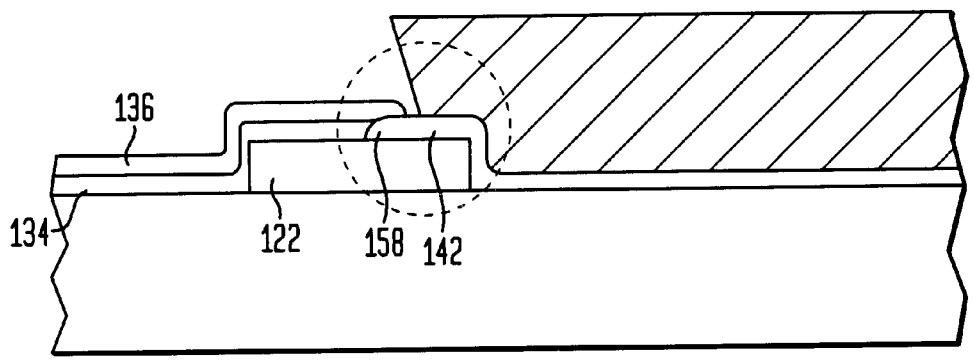
Figures 2, 2G:
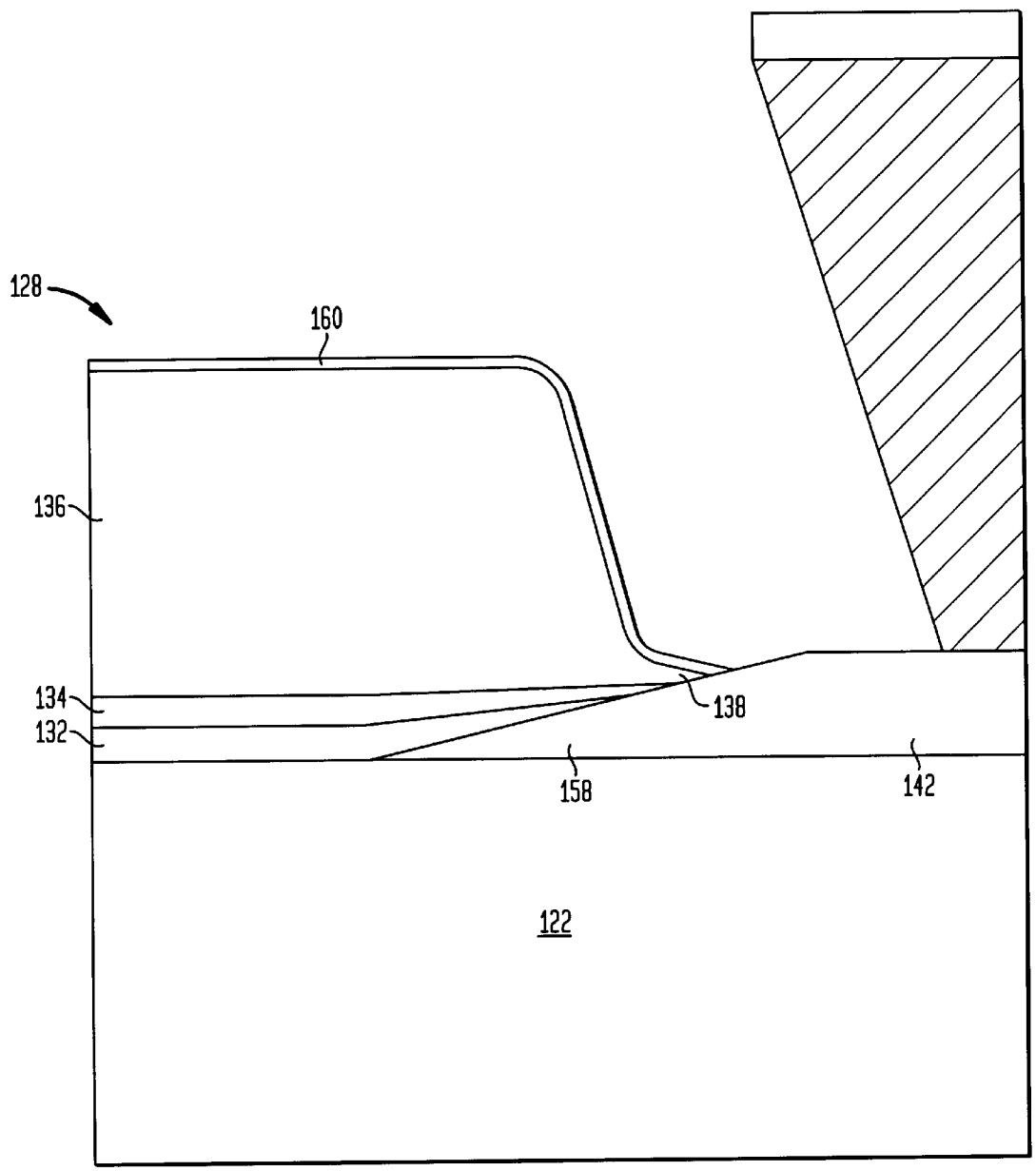

Referring to FIGS. 2G and 2G-1, a barrier metal 134 is then deposited atop the substrate 110, the semiconductor device 122 and the photoresist layer 116. In addition, because the photoresist layer 116 has been eroded to expose protected portion 158 of dielectric material 142, the barrier metal 134 deposited atop the semiconductor device 122 will overlie and/or overlap the protected portion 158 of the dielectric material 142. Next, a contact metal 136 is deposited atop the barrier metal layer 134. Because the barrier metal 134 overlaps the dielectric material 142, the contact metal 136 is isolated from semiconductor device 122. As a result, the contact metal 136 will not diffuse into the semiconductor device 122, thereby avoiding the adverse problems described above.

FIG. 2G-2 shows a magnified view of the contact formed in FIG. 2G. The contact 128 has multiple layers including adhesion metal 132 deposited atop semiconductor 122 and overlapping the edge of dielectric passivation layer 142, barrier metal layer 134 deposited atop the adhesion metal layer 132, contact metal layer 136 deposited atop barrier metal layer 134 and a second adhesion metal 160 deposited atop contact metal layer 136. In spite of the fact that contact metal layer 136 has a tail portion 138 that overlaps barrier metal layer 134, the dielectric passivation layer 142 under the tail 138 is sufficiently thick so as to isolate the contact metal 136 from semiconductor device 122. As a result, the contact metal layer 136 is isolated from semiconductor 122 so that the interaction and/or interdiffusion problems described above will not occur. Thus, the present invention provides a method of forming self-aligned contacts whereby contact metal is effectively isolated from the semiconductor.

Figure 3A:
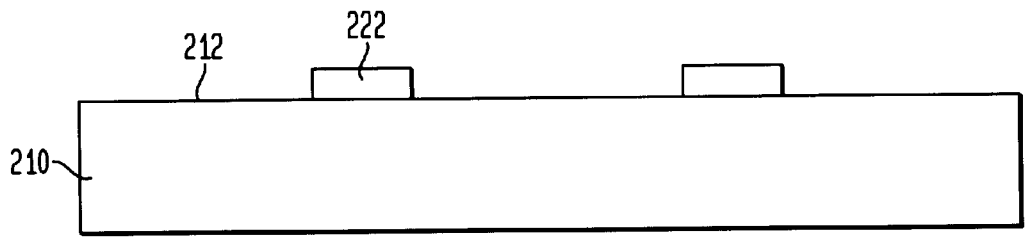
Figure 3B:
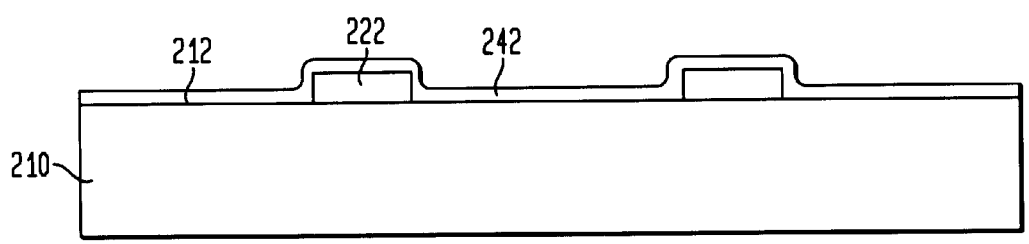

FIGS. 3A–3F-1 show a method of making self-aligned contacts on a semiconductor device in accordance with further preferred embodiments of the present invention. Referring to FIG. 3A, substrate 210 has a top surface 212 with semiconductors 222, such as semiconductor mesas, formed thereon. As shown in FIG. 3B, a passivation layer 242 of a dielectric material is then deposited atop the first surface 212 of substrate 210 and over the semiconductors 222.

Figure 3C:
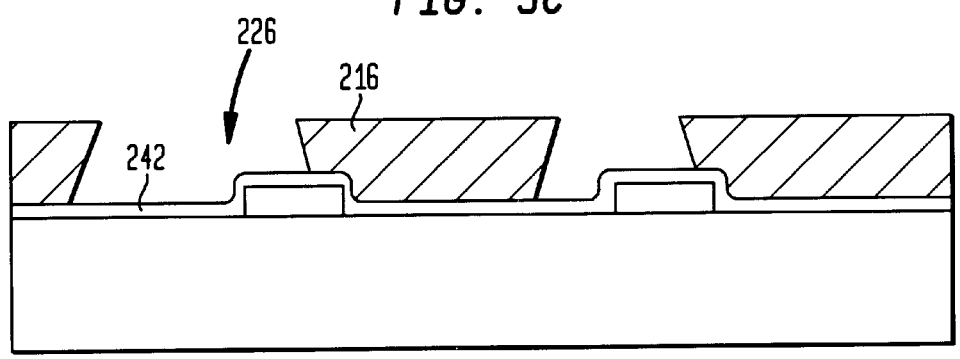
Figure 3D:
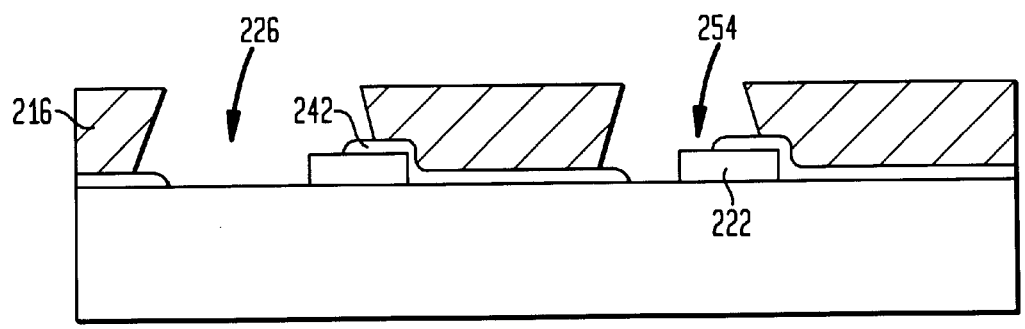
Figure 3E:
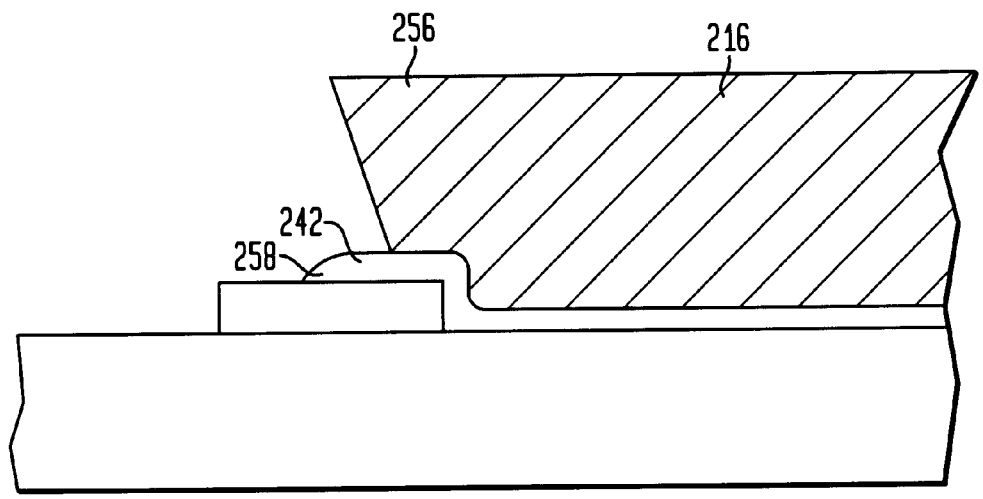

Referring to FIG. 3C, a photoresist layer 216 is then deposited atop the dielectric passivation layer 242. Using photolithographic methods, openings 226 are then exposed and developed in the photoresist layer 216. The openings 226 preferably conform to desired patterns of conductive traces or contacts to be formed atop the substrate. Referring to FIG. 3D, the dielectric passivation layer 242 is then subjected to an etching process so as to selectively remove portions of the dielectric material 242 exposed through openings 226 in photoresist layer 216. The etched-away dielectric material leaves contact openings 254 that extend to the top surface of the substrate 210 and the semiconductors 222. FIG. 3E shows a close up view of a portion of the structure shown in FIG. 3D. Because photoresist layer 216 has an undercut profile, an upper edge 256 of photoresist layer 216 overhangs the protected portion 258 of dielectric material 242, thereby partially protecting the protected portion 258 from being removed during the etching step. As a result, a protected portion 258 of dielectric material 242 projects beyond the bottom of the photoresist layer 216.

Figure 3F:
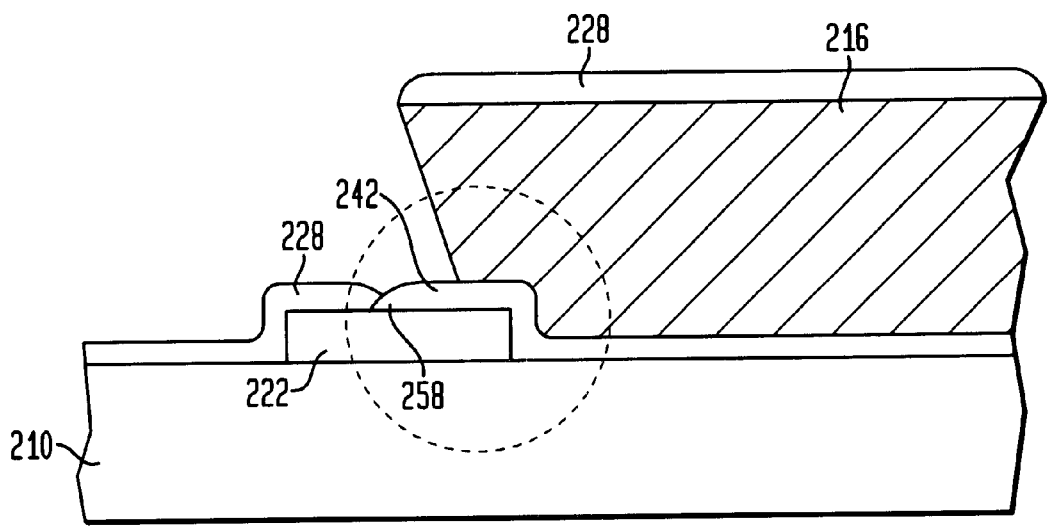
Figures 1, 3F:
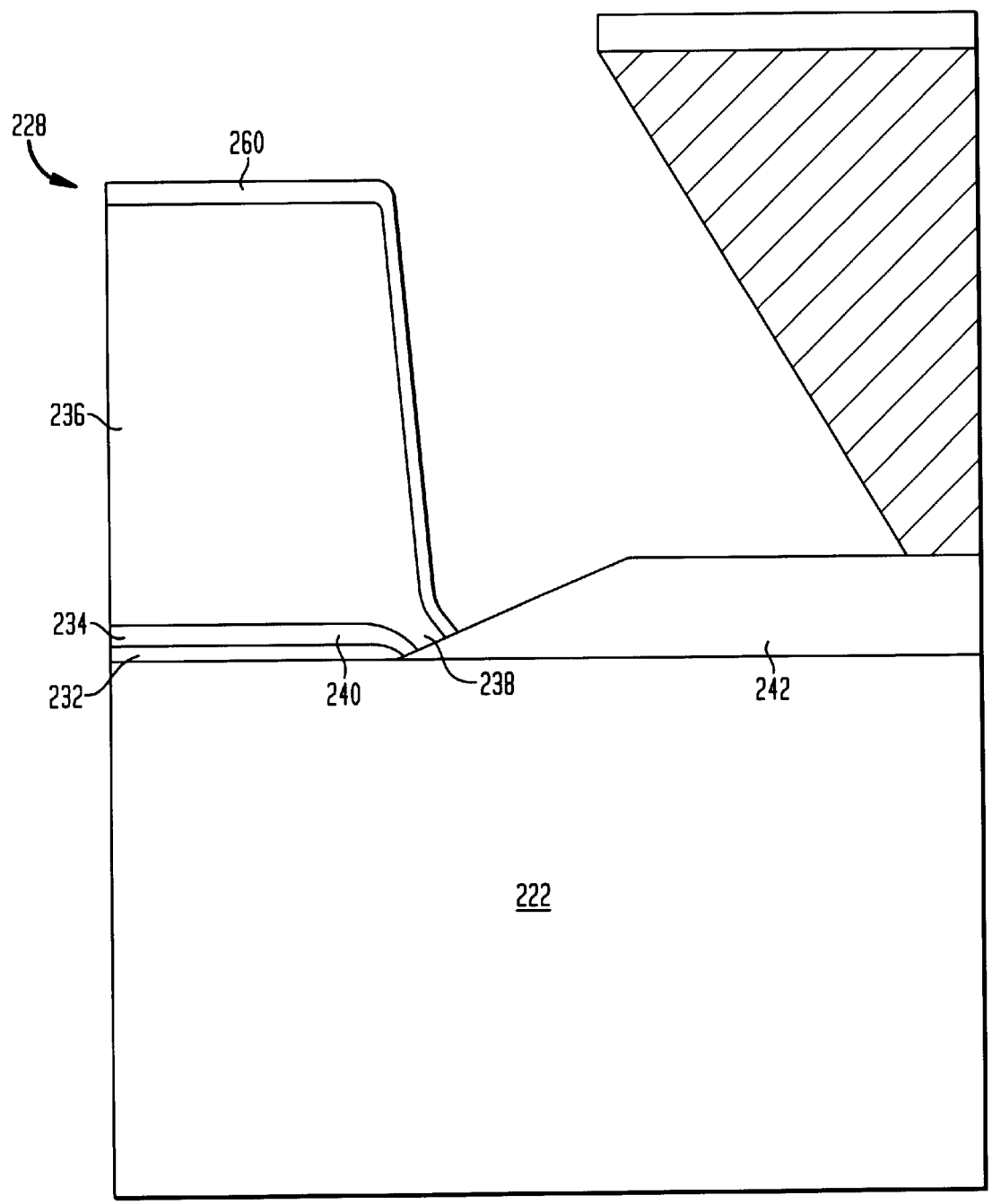

Referring to FIG. 3F, a metal layer 228 is then deposited atop the substrate 210, the semiconductor device 222 and the photoresist layer 216. At least a portion of the metal layer 228 overlaps the now exposed protected portion 258 of dielectric passivation layer 242. FIG. 3F-1 shows a magnified view of the structure shown in FIG. 3F. Although the present invention is not limited by any particular theory of operation, it is believed that as the various metal layers of contact 228 are deposited, a thicker layer formed atop a thinner layer will have edges that generally extend slightly beyond the edges of the thinner layer, thereby forming what is commonly referred to as a tail. As a result, contact metal layer 236 will have a tail 238 extending beyond the edge 240 of barrier metal layer 234 and onto dielectric passivation layer 242. Thus, the tail 240 of the barrier metal 234 effectively isolates contact metal 236 from semiconductor 222, thereby avoiding the interdiffusion problems described above.

Figure 4A:
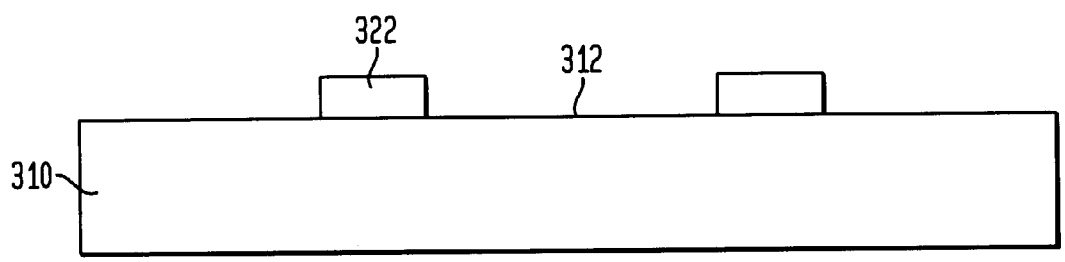
Figure 4B:
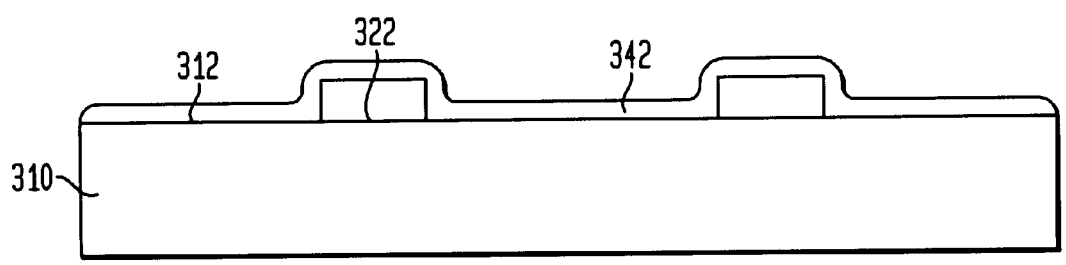
Figure 4C:
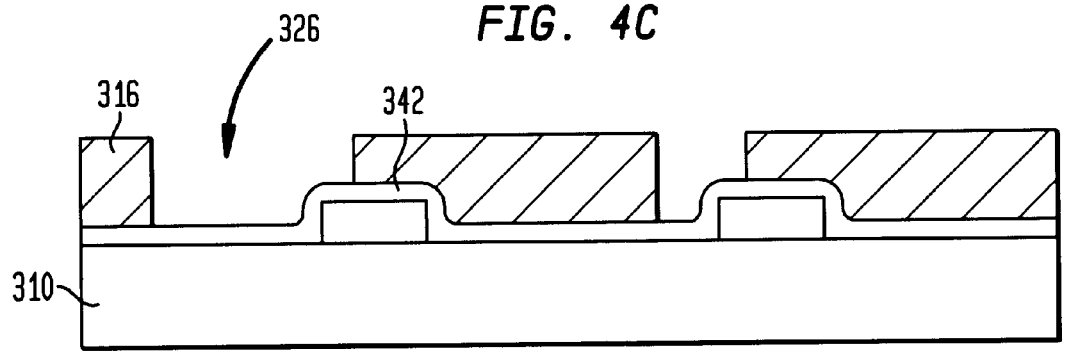
Figure 4D:
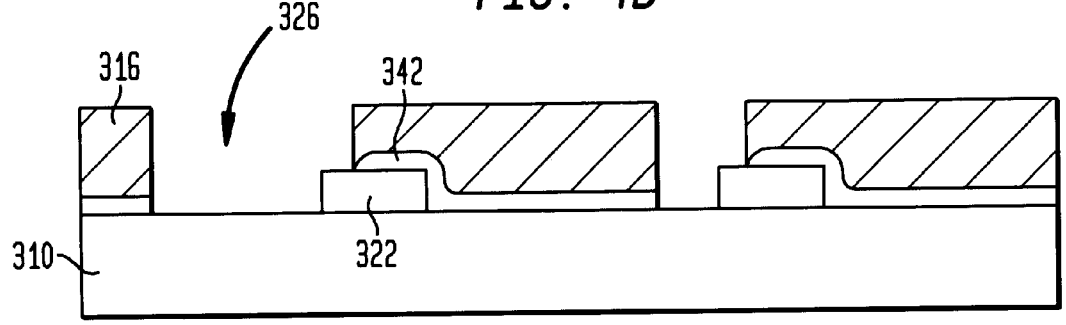

FIGS. 4A–4G-1 show methods of making self-aligned contacts for semiconductors in accordance with yet further preferred embodiments of the present invention. Referring to FIG. 4A, substrate 310 includes top surface 312 having one or more semiconductors 322 formed thereon. In a first process step, dielectric passivation layer 342 is deposited over first surface 312 of substrate 310 and semiconductors 322, as shown in FIG. 4B. Referring to FIG. 4C, a photoresist layer 316 is then deposited atop passivation layer 342 and openings 326 are defined in photoresist layer 316, using the techniques described above. Referring to FIG. 4D, the portions of the passivation layer 342 exposed through the openings 326 in photoresist layer 316 are removed, such as by etching away the exposed portions 358 of passivation layer 342. In the embodiments shown in FIGS. 4A–4G-2, the openings formed in photoresist layer 316 extend in substantially vertical directions. As a result, the openings in photoresist layer 316 do not have the undercut profile shown and described above in FIGS. 2A–2G-2.

Figure 4E:
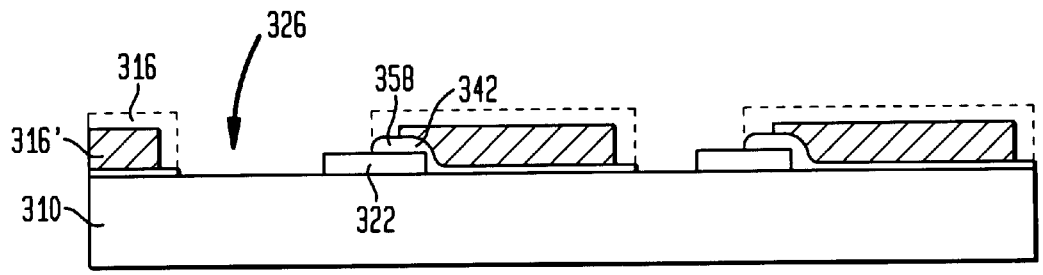
Figure 4F:
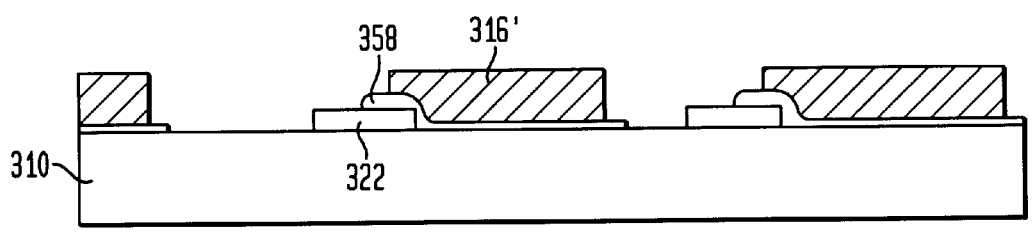
Figure 4G:
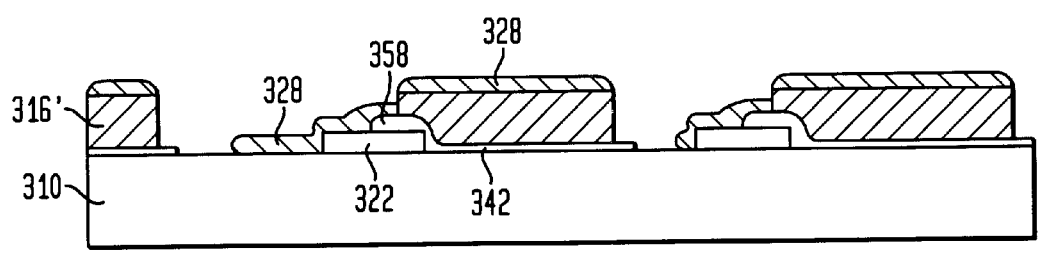
Figures 1, 4G:
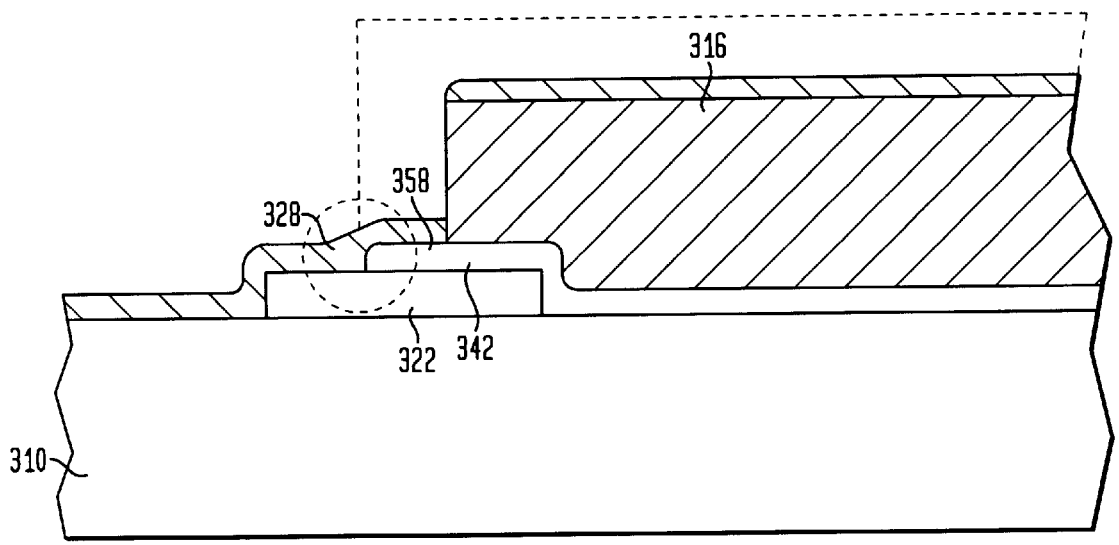
Figures 2, 4G:
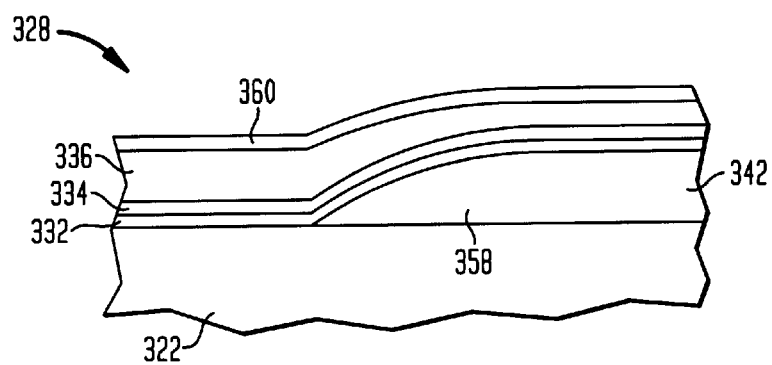

Referring to FIG. 4E, photoresist layer 316 is then eroded so as to reduce the overall area of the photoresist layer. The reduction of the photoresist layer is from the initial dimension shown by dashed lines 316 to the final dimension shown by solid lines 316'. As a result of eroding the photoresist layer 316', the size of the openings 326 in the photoresist layer increases, thereby exposing an additional portion 358 of passivation layer 342. The exposed portion 358 of passivation layer 342 is shown in more detail in FIG. 4F. Referring to FIG. 4G, after additional portion 358 of passivation layer 342 has been exposed, a metal layer 328 is then deposited atop the substrate. The metal layer 328 overlaps the exposed portion 358 of the passivation layer 342.

FIG. 4G-1 shows a magnified view of the structure shown in FIG. 4G with contact 328 overlapping exposed portion 358 of passivation layer 342. FIG. 4G-2 shows a magnified view of a portion of the contact formed atop semiconductor 322. Semiconductor 322 has an exposed portion 358 of passivation layer 342 deposited thereon. Contact 328 is formed by depositing multiple layers of metal. A first layer of an adhesion metal layer 332 is deposited atop the semiconductor 322 and passivation layer 342. Next, barrier metal layer 344 is deposited atop adhesion metal layer 332. A contact metal 336 is then deposited atop barrier metal layer 334. Barrier metal layer 334 isolates contact metal 336 from the active surface of semiconductor 322 so as to avoid the interaction problems described above. Finally, a second adhesion metal layer 360 may be deposited atop contact metal 336.

Although the present invention has been described with reference to particular preferred embodiments, it is to be understood that the embodiments are merely illustrative of the principles and application of the present invention. It is therefore to be understood that numerous modifications may be made to the preferred embodiments and that other arrangements may be devised without departing from the spirit and scope of the present invention as defined by the claims.

What is claimed is:

1. A method of forming a self-aligned contact on a semiconductor comprising:

forming a layer of a dielectric material over a semiconductor;

providing a photoresist layer over the dielectric layer;

exposing the photoresist layer with a desired pattern and developing an opening in said photoresist layer;

removing the dielectric material exposed through the photoresist layer opening to form a contact opening extending through the dielectric material to the semiconductor;

after the step of removing the dielectric material for forming the contact opening extending through the dielectric material to the semiconductor, further eroding the photoresist layer so as to enlarge the size of the opening in the photoresist layer, wherein said dielectric material adjacent the contact opening is exposed through the enlarged opening of said photoresist layer;

depositing a barrier metal in the enlarged opening of said photoresist layer and in the contact opening of said dielectric material, wherein said barrier metal overlies the exposed dielectric material; and depositing a contact metal atop said barrier metal, wherein said barrier metal prevents said contact metal from diffusing into said semiconductor.

2. The method as claimed in claim 1, wherein the developing step includes forming an undercut profile in said photoresist layer.

3. The method as claimed in claim 1, further comprising depositing an adhesion metal in the contact opening of said dielectric material before depositing the barrier metal.

4. The method as claimed in claim 1, further comprising depositing an adhesion metal atop said contact metal.

5. The method as claimed in claim 1, wherein said dielectric layer comprises an impervious non-conductive material.

6. The method as claimed in claim 1, wherein said dielectric layer is selected from the group consisting of glass, ceramic, Silicon Oxide, Silicon Nitride and Aluminum Oxide.

7. The method as claimed in claim 1, wherein said barrier metal is selected from the group consisting of platinum, tungsten, palladium, and combinations or alloys thereof.

8. The method as claimed in claim 1, wherein said contact metal is selected from the group consisting of gold, silver, aluminum and copper.

9. The method as claimed in claim 1, wherein the removing the dielectric material includes exposing said dielectric material to an etchant.

10. The method as claimed in claim 1, wherein the removing the dielectric material includes etching said dielectric material so as to expose a top surface of said semiconductor.

11. The method as claimed in claim 10, wherein the pattern etched in said dielectric material substantially conforms to the opening in said photoresist layer.

12. The method as claimed in claim 1, further comprising lifting off the photoresist layer after the depositing the conductive metal.

13. The method as claimed in claim 1, wherein said contact is a multi-layer structure including an adhesion metal, a barrier metal and a contact metal.

14. A method of forming a self-aligned contact on a semiconductor comprising:

forming a layer of a dielectric material over a semiconductor;

providing a photoresist layer over the dielectric layer;

exposing the photoresist layer with a desired pattern and developing one or more openings in said photoresist layer;

removing the dielectric material exposed through the one or more openings of the photoresist layer to form one or more contact openings extending through the dielectric material to the semiconductor;

after the step of removing the dielectric material for forming the one or more contact openings extending through the dielectric material to the semiconductor, further eroding the photoresist layer so as to reduce the volume of said photoresist layer wherein the eroding the photoresist step enlarges the one or more openings in the photoresist layer so that the dielectric material adjacent the one or more contact openings is exposed through the one or more enlarged openings of said photoresist layer;

depositing a barrier metal in the one or more openings of said photoresist layer and in the one or more contact openings of said dielectric material, wherein said barrier metal overlies the exposed dielectric material; and depositing a contact metal atop said barrier metal, wherein said barrier metal prevents said contact metal from diffusing into said semiconductor.

15. The method as claimed in claim 14, wherein the developing step includes forming an undercut profile in said photoresist layer.

16. The method as claimed in claim 14, further comprising depositing an adhesion metal in the one or more contact openings of said dielectric material before depositing the barrier metal.

17. The method as claimed in claim 14, further comprising depositing an adhesion metal atop said contact metal.

18. The method as claimed in claim 14, wherein the layer of said dielectric material is substantially impervious and non-conductive material.

19. A method of forming self-aligned contacts on a semiconductor substrate comprising:

providing a substrate having a first surface;

forming a plurality of semiconductors accessible at the first surface of said substrate;

forming a dielectric passivation layer over said substrate and said semiconductors;

providing a photoresist layer over said dielectric passivation layer;

exposing the photoresist layer with a pattern and developing an opening in said photoresist layer, said photoresist layer opening substantially conforming to said pattern;

removing the dielectric material exposed through the photoresist layer opening so as to form contact openings, each said contact opening extending through the dielectric material to one of the semiconductors;

after the step of removing the dielectric material for forming the contact openings extending through the dielectric material to one of the semiconductors, further eroding the photoresist layer so as to enlarge the size of the openings in the photoresist layer, wherein said dielectric material adjacent the contact openings is exposed through the enlarged openings of said photoresist layer;

depositing a barrier metal in the enlarged openings of said photoresist layer and in the contact openings of said dielectric material, wherein said barrier metal overlies the exposed dielectric material; and depositing a contact metal atop said barrier metal, wherein said barrier metal isolates said contact metal from said semiconductors so as to prevent said contact metal from diffusing into said semiconductors.

* * * * *

UNITED STATES PATENT AND TRADEMARK OFFICE
CERTIFICATE OF CORRECTION

PATENT NO. : 6,420,252 B1
DATED : July 16, 2002
INVENTOR(S) : Stephen Schwed, Louis A. Koszi, Edward W. Douglas and Michael G. Brown It is certified that error appears in the above-identified patent and that said Letters Patent is hereby corrected as shown below:

<u>Title page,</u>
Item [75], Inventors, after Edward W. Douglas, Randolph, insert -- NJ --; and after Michael G. Brown, "Clinton" should read -- Valrico --; and "both of NJ" should read -- FL --.

<u>Column 1,</u>
Line 62, "11" should read -- 1I --.

Signed and Sealed this

Seventeenth Day of December, 2002

JAMES E. ROGAN
*Director of the United States Patent and Trademark Office*